United States Patent
Tseng et al.

(10) Patent No.: US 12,347,614 B2
(45) Date of Patent: Jul. 1, 2025

(54) ELECTROMAGNETIC SYSTEMS FOR THE SELECTIVE MANIPULATION OF MAGNETICALLY-BARCODED MATERIALS

(71) Applicant: The Regents of the University of California, Oakland, CA (US)

(72) Inventors: Peter Tseng, Oakland, CA (US); Amirhossein Hajiaghajani, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 450 days.

(21) Appl. No.: 17/764,753

(22) PCT Filed: Sep. 29, 2020

(86) PCT No.: PCT/US2020/053281
§ 371 (c)(1),
(2) Date: Mar. 29, 2022

(87) PCT Pub. No.: WO2021/067272
PCT Pub. Date: Apr. 8, 2021

(65) Prior Publication Data
US 2022/0384081 A1   Dec. 1, 2022

Related U.S. Application Data

(60) Provisional application No. 62/907,849, filed on Sep. 30, 2019.

(51) Int. Cl.
*H01F 7/02* (2006.01)
*H01F 1/44* (2006.01)
*H01F 7/20* (2006.01)

(52) U.S. Cl.
CPC ............ *H01F 7/0247* (2013.01); *H01F 1/44* (2013.01); *H01F 7/206* (2013.01)

(58) Field of Classification Search
CPC   G01R 33/06; G01R 33/1215; G01R 33/1276; G07D 7/0043; G07D 7/04;
(Continued)

(56) References Cited

U.S. PATENT DOCUMENTS 8,931,703 B1 *   1/2015   Mullen ............... G06K 19/083
235/487
2005/0225098 A1   10/2005   Kliefoth et al.
(Continued)

OTHER PUBLICATIONS

Foreign Search Report on PCT PCT/US2020/053281 Dtd Feb. 17, 2021.
(Continued)

*Primary Examiner* — Thien M Le
(74) *Attorney, Agent, or Firm* — FOLEY & LARDNER LLP

(57) ABSTRACT

Embodiments herein are directed to a system and a method of selectively manipulating magnetically-barcoded materials from background magnetic materials. Magnetic barcodes include layers of magnetic anisotropy. These are then manipulated by a magnetic system that can drive spatio-temporal magnetic fields that can "match" a barcode to drive a specific interaction, thereby providing a "lock-key" interaction. This technique is able to selectively manipulate magnetically-barcoded materials, and can have applications across a variety of magnetic systems such as cell separation, drug delivery, valves, and motors.

18 Claims, 13 Drawing Sheets

(58) Field of Classification Search
CPC ........ H01F 1/44; H01F 13/003; H01F 7/0247; H01F 7/206; G06F 18/22
See application file for complete search history.

(56) References Cited

U.S. PATENT DOCUMENTS

| | | |
|---|---|---|
| 2007/0257565 A1 | 11/2007 | Urey et al. |
| 2007/0268141 A1* | 11/2007 | Arnold .................. G01V 15/00 340/572.6 |
| 2011/0007955 A1 | 1/2011 | Ho et al. |
| 2012/0229241 A1 | 9/2012 | Fullerton et al. |
| 2013/0252375 A1* | 9/2013 | Yi .......................... H01L 24/80 438/107 |
| 2014/0108197 A1* | 4/2014 | Smith ................ G06Q 20/3223 705/26.9 |
| 2014/0266186 A1* | 9/2014 | Osterfeld ............. G01N 27/745 324/252 |
| 2015/0045641 A1* | 2/2015 | Rule ................ A61B 5/150229 600/347 |
| 2015/0348349 A1 | 12/2015 | Meisenberg et al. |
| 2016/0217308 A1* | 7/2016 | Shen ................ G06K 19/06028 |
| 2021/0268465 A1* | 9/2021 | Di Carlo .............. B01J 13/0069 |
| 2021/0287013 A1* | 9/2021 | Carter ..................... G06F 18/24 |
| 2024/0246215 A1* | 7/2024 | Burnett ................ B21D 39/048 |

OTHER PUBLICATIONS

Liong el al., "Magnetic barcode assay for genetic detection of pathogens," Nature Communications, (2013), 9 pages.

\* cited by examiner

ELECTROMAGNETIC SYSTEMS FOR THE SELECTIVE MANIPULATION OF MAGNETICALLY-BARCODED MATERIALS

CROSS-REFERENCE TO RELATED APPLICATIONS

The present application is a 371 National Stage Entry of International Application No. PCT/US2020/053281, filed Sep. 29, 2020, which claims priority to U.S. Provisional Patent Application No. 62/907,849 filed Sep. 30, 2019, the contents of each of which are incorporated herein by reference in their entirety.

TECHNICAL FIELD

The present embodiments relate generally to electromagnetic systems and more particularly to systems and methods of selectively manipulating magnetically-barcoded materials from background magnetic materials.

BACKGROUND

Comparative magnetic manipulation systems manipulate all magnetic structures, and thus they lack selectivity. This is a major flaw with comparative magnetic separation, manipulation, and latching techniques. Some techniques utilize complex encompassing magnetic platforms (that can manipulate magnetic fields in space and time) to obtain more complex interactions. Gradient ratcheting is able to obtain some sub-selection based on size, but lacks sufficient ability to select between magnetic tags. This lack of selectivity is a main flaw behind comparative magnetic systems.

SUMMARY

Embodiments herein are directed to a system and a method of selectively manipulating magnetically-barcoded materials from background magnetic materials. Magnetic barcodes include layers of magnetic anisotropy. These are then manipulated by a magnetic system that can drive spatio-temporal magnetic fields that can "match" a barcode to drive a specific interaction, thereby providing a "lock-key" interaction. This technique is able to selectively manipulate magnetically-barcoded materials, and can have applications across a variety of magnetic systems such as cell separation, drug delivery, valves, and motors.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIG. 2(a) illustrates that a propelling force is induced to drive spatial alignment between the magnetic barcode and its matching external magnetic field.

FIG. 4(a) illustrates arrays of permanent magnets or flexible planar coils are used to generate spatio-temporal, programmable magnetic fields. This will act as either the encoder for magnetic materials, or as the platform to manipulate magnetic barcodes. The bidirectional magnetic field streamlines are highlighted by dashed boxes in the cut plane. FIG. 4(b) illustrates the fabricated magnetic systems using 3D printed scaffold for magnets and vinyl tape for flexible aluminum traces.

FIG. 5(a) illustrates the magnetically-barcoded hydrogel on a plastic coverslip and FIG. 5(b) the micro-magnetic chains in (FIG. 5(c)) x- and (FIG. 5(d)) z-directions.

FIG. 6(a) is a schematic of the magnetic anchor platform including the auxiliary coil arrays. FIG. 6(b) illustrates a realization of the anchor platform using an array of permanent magnets and FIG. 6(c) illustrates an array of planar coils (scale bar 20 mm).

FIG. 7(a) illustrates a sample lock protocol for the magnetic platform. The key interacts with the latch when a matching barcode is recognized. FIG. 7(b) illustrates a comparison between the encoded and uncoded tags. The correlation between the key and latch barcodes can be translated to the magnetic potential energy stored in the key (P=8, Q=48).

FIG. 8(c) illustrates an extracted motion graph from the video records. It is observed that the coded hydrogel is captured in the latch site while the uncoded continues moving with approximately zero acceleration

FIG. 11 illustrates distribution of the magnetic fields generated by magnets and coils where all coils are turned on according to embodiments. Depending on the latch place, particular loops can be selectively turned on.

FIG. 12(a) illustrates the hydrogel mold and magnets scaffold are both 3D printed and designed to be assembled. FIG. 12(b) illustrates layers of the flexible planar coils.

DETAILED DESCRIPTION

Figure 1:
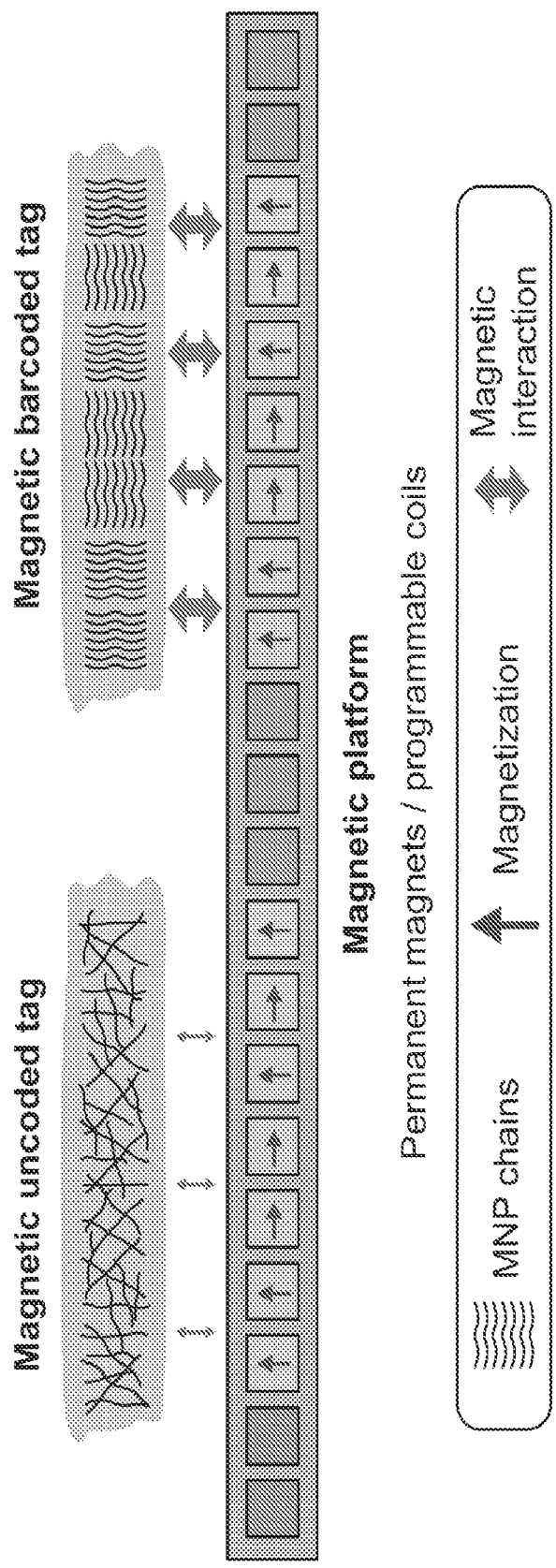
FIG. 1 illustrates selective manipulation of magnetic barcodes according to embodiments. This strategy involves encoding layers of programmed magnetic anisotropy into a material (creating a magnetic barcode), and engineering selective interactions with programmable external magnetic substrates.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

Selective Manipulation and Trapping of Magnetically-Barcoded Materials

Overview

Manipulation of magnetic materials (including remote-controlled motions or structural deformations) plays a major role in modern micro- to macro-scale systems. Magnetic operations create highly predicable outcomes in the behavior of systems; however, these have difficulty performing subordinate and/or higher-order operations. This lack of selectivity remains a drawback of magnetic manipulation schemes. Here, a strategy of engineering highly-selective magnetic responses is evaluated and implemented. This is achieved by combining magnetic barcodes ("keys" encoded with layers of magnetic anisotropy) with programmable magnetic platforms (locking select codes in place with matching spatio-temporal magnetic fields). In some embodiments, barcodes are realized by encoding hydrogel with sequences of magnetic micro-chains with binary spatial orientations. A number of capabilities of this approach are evaluated, including the untethered, selective anchoring of magnetic barcodes to programmable sites, as well as the selective latching of barcodes against background magnetic tags during flow. This approach may be used as a building block in micro- to macro-scale magnetic interfaces.

Introduction

Magnetic manipulation broadly encompasses the physical interaction of magnetic fields with materials to induce deformations, translational motions, and/or modifications in the characteristics of these materials. It can play a major role in a wide variety of biomedical applications, ranging from tissue engineering, lab-on-chip microsystems, drug delivery, cell separation, to micro-robots. The minimally invasive nature of this technique, alongside the fact that few biological constructs possess magnetic properties, have made such manipulations particularly suited for living systems. Here, magnetic materials are used as tags to allow the manipulation of specific objects within such systems.

The magnetic manipulation of ferromagnetic and paramagnetic tags is typically based on either the magnetic torque or magnetophoretic force induced within an external uniform or gradient magnetic field, respectively. Complex magnetic manipulations can then be programmed by controlling the direction or intensity of this incident magnetic field. The simplicity of such operations lends both strengths and weaknesses—these create highly predictable outcomes in the behavior of tagged objects yet, however, are incapable of subordinate and/or higher order operations. One technique to increase the capabilities of manipulation schemes is the engineering of electromagnetic platforms that can apply spatial and/or time-varying magnetic fields. Despite the more complex capabilities of such techniques, these are not selective and influence all nearby ferromagnetic (or paramagnetic) media. This lack of selectivity remains a drawback of magnetic manipulation schemes.

Here, a strategy of engineering highly-selective magnetic responses within magnetic manipulation schemes is devised. This is achieved by combining barcoded magnetic tags (encoded with layers of anisotropy) with magnetic platforms (controlling magnetic stimuli), and is shown in FIG. 1. This approach is inspired by biological systems, wherein selective responses are achieved through a lock-key feature of proteins, enzymes, or DNA. In the magnetic scheme evaluated herein, magnetic tags are composed of a programmed combination of magnetic characteristics (possessing heterogeneous and anisotropic magnetization profile). This stands in contrast to comparative magnetic tags that exhibit a homogeneous magnetic response. This magnetic barcoded tag satisfies a series of conditions to interact strongly with an external stimulus. By engineering the external stimulus with arrays of permanent magnets or coils, selectively manipulation of such encoded tags from background magnetic materials is attained via the enhanced interactions that occur with matching codes.

In the synthesis of the magnetic barcodes, strategies are leveraged to create anisotropic magnetic materials that possess unique rotational responses under an external magnetic field. In such systems, magnetic nanoparticles (MNPs) are trapped in particular chain orientations during polymer gelation. In addition, the profile of the chains' angular distributions will vary based on the spatial pattern of an external magnetic field. Hence, these synthesized materials inherit magnetic properties from external magnetic fields. Encoded magnetic patterns are generated by arrays of small permanent magnets. Moreover, a method is proposed to fabricate flexible planar coils that can be utilized to selectively trap specific tags.

To host MNPs, a variety of polymers can be utilized. Among biocompatible networks, hydrogels exhibit highly tunable properties and can be engineered to be triggered by environmental stimuli such as temperature, light, tension, and magnetic fields. Hydrogels infiltrated by MNPs can be employed in numerous applications such as controlled release in drug delivery, cell culturing, micro-robots, and programmable shaping of soft materials. Magnetic hydrogels are powerful structures to realize programmable magnetic characteristics because they can be readily encoded with micro-chains of MNPs, as is specified by the proposed system.

In some embodiments, utilization is made of magnetically-encoded hydrogels that exhibit selective interactions due to their magnetic barcoding. Under a patterned magnetic field, bidirectional MNP chains encode layers of programmed anisotropy within a flexible hydrogel platform. These magnetic-barcodes will then preferentially interact with their matching magnetic codes, allowing trapping of desired magnetic targets selectively from background magnetic media.

Design of the Magnetically-Encoded Materials

Generally, ferromagnetic materials move or rotate to reduce their potential energy. As an illustration, MNP chains can be modeled by magnetic dipoles with a magnetization of $\vec{m}$ along their axis. A gradient magnetic field of $\vec{H}$ applies magnetophoretic force proportional to $(\vec{m} \cdot \nabla)\vec{H}$ on the dipole. Moreover, under an external magnetic flux density of $\vec{B}$, the dipole experiences a magnetic torque of $\vec{N}(=\vec{m} \times \vec{B})$ until it rotates and aligns with $\vec{B}$. Similarly, a magnetized tag would experience a propelling force under a misaligned external magnetic field until its magnetization aligns with the external magnetic field, where the tag anchors. However, in general, magnetic forces can affect all surrounding magnetic tags and often lead them to eventually accumulate at a point.

Figures 2A, 2B:
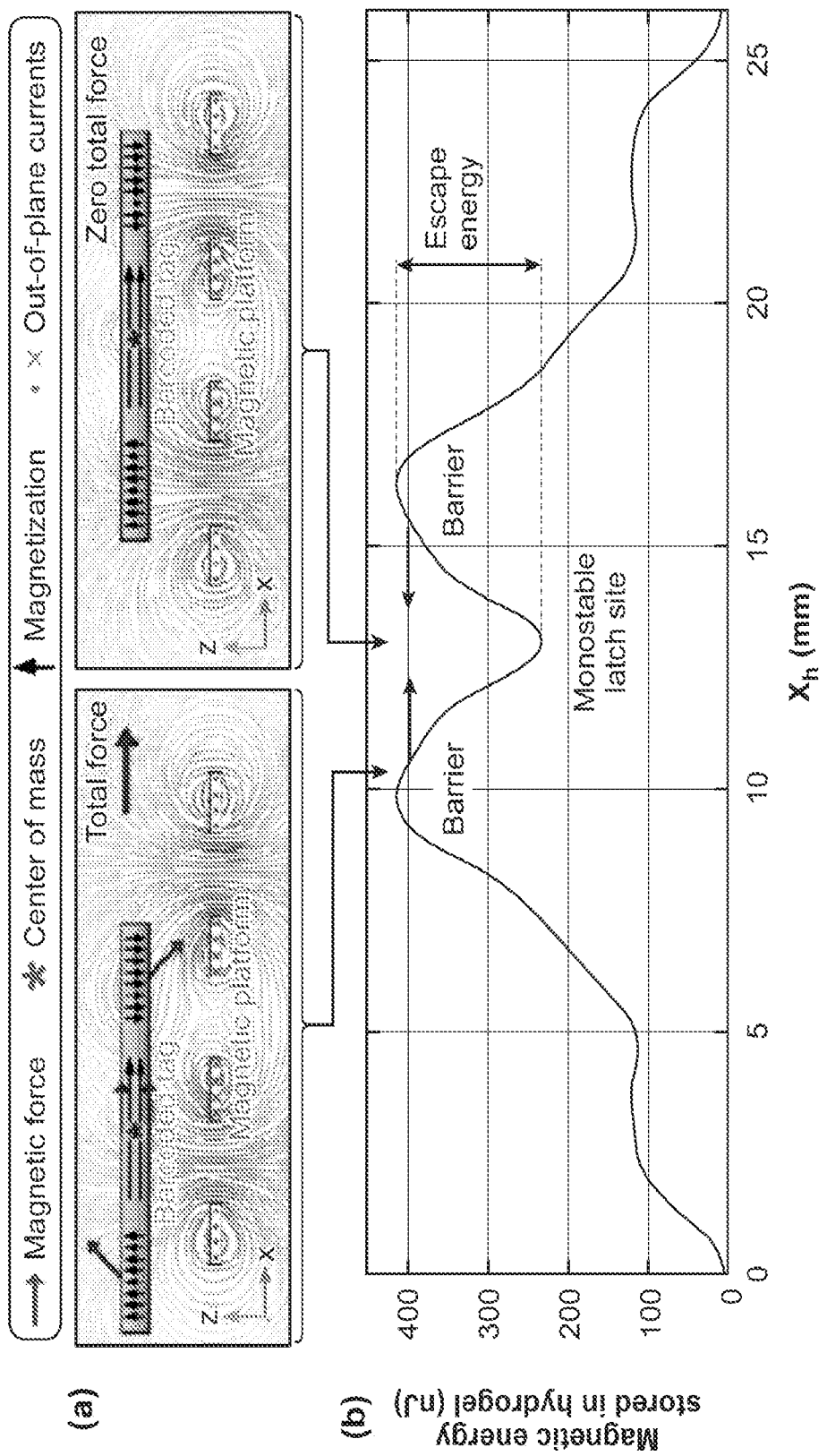
FIGS. 2(a) and (b) illustrate magnetic interactions between an external magnetic field and a tag encoded with anisotropic and heterogeneous magnetization.
FIG. 2(b) illustrates that the magnetic potential energy stored in the tag shows an energy well that represents the latch site that anchors its corresponding encoded tag.

Here, evaluation is made on how encoding successive domains of anisotropy into a material can be used to selectively enhance its interaction with corresponding spatiotemporally-engineered external magnetic fields. Suppose a floating, magnetized tag contains several subdomains with a particular series of magnetization vectors. An anchoring platform should generate a magnetic field whose streamlines align with the entire magnetization series. This system results in the creation of a monostable latch site, exhibiting enhanced interactions with that particular tag (FIG. 2(a)). The generated magnetic force field can be represented by the potential magnetic energy that is capable of being stored in the tag. A finite element simulation is performed in COMSOL to find the potential energy stored in the moving barcoded tag, whose location ($x_h$) sweeps over the x-axis. Initially, the mismatch between the tag's anisotropy code and the patterned magnetic fields leads the tag to move until an overall pattern match is observed. Any perturbation in $x_h$ will induce a prohibitive force. This anchors the tag until the perturbation energy is greater than the certain amount that lets the tag unlatch (FIG. 2(b)).

Synthesis of the Magnetically-Barcoded Tags

Figure 9:
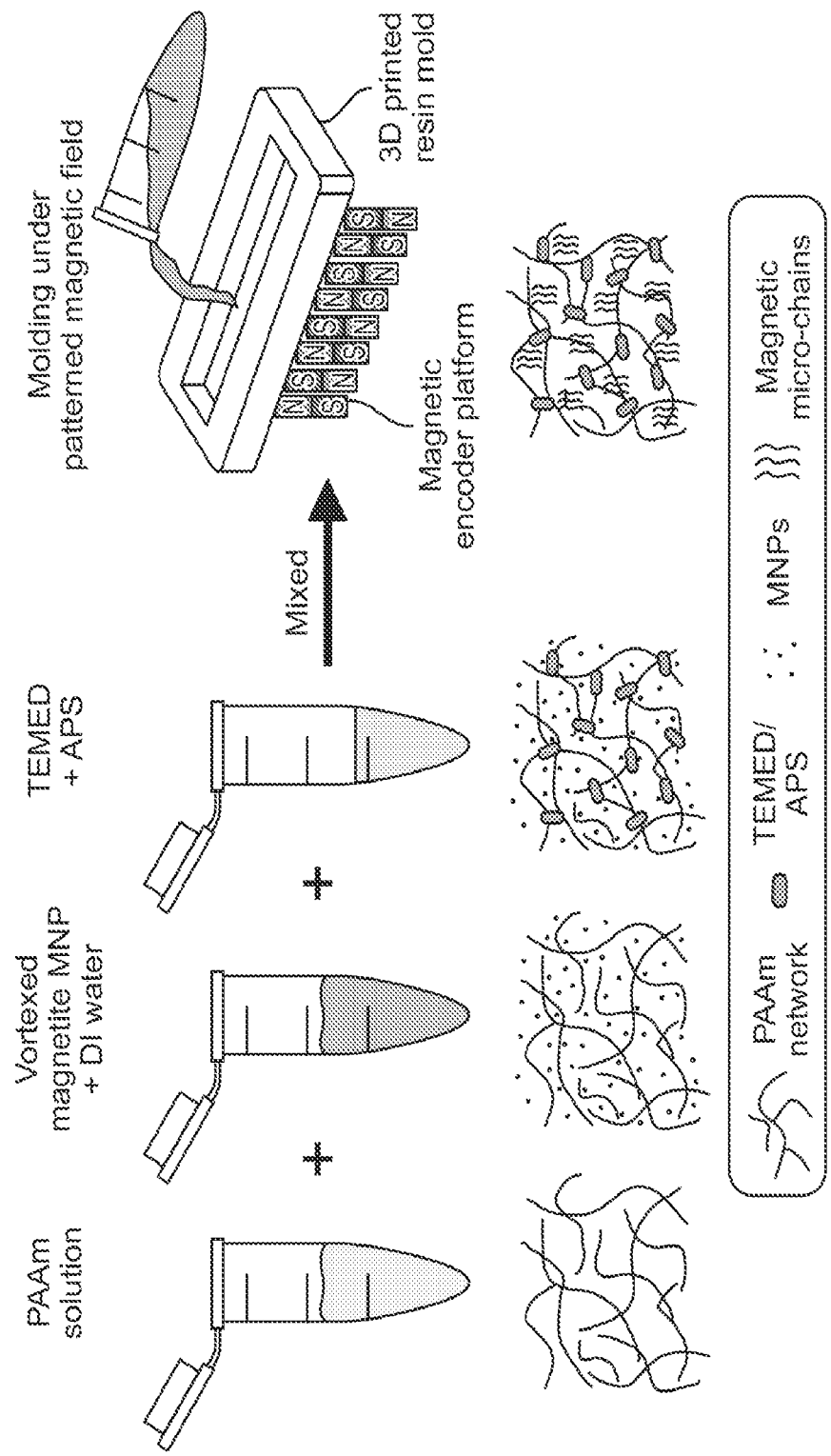
FIG. 9 illustrates a fabrication process for a PAAm magnetic hydrogel according to embodiments. The gelation of the PAAm network freezes the location and orientation of the magnetic micro-chains resulting in encoded magnetic sites within the gel.
Figure 10:
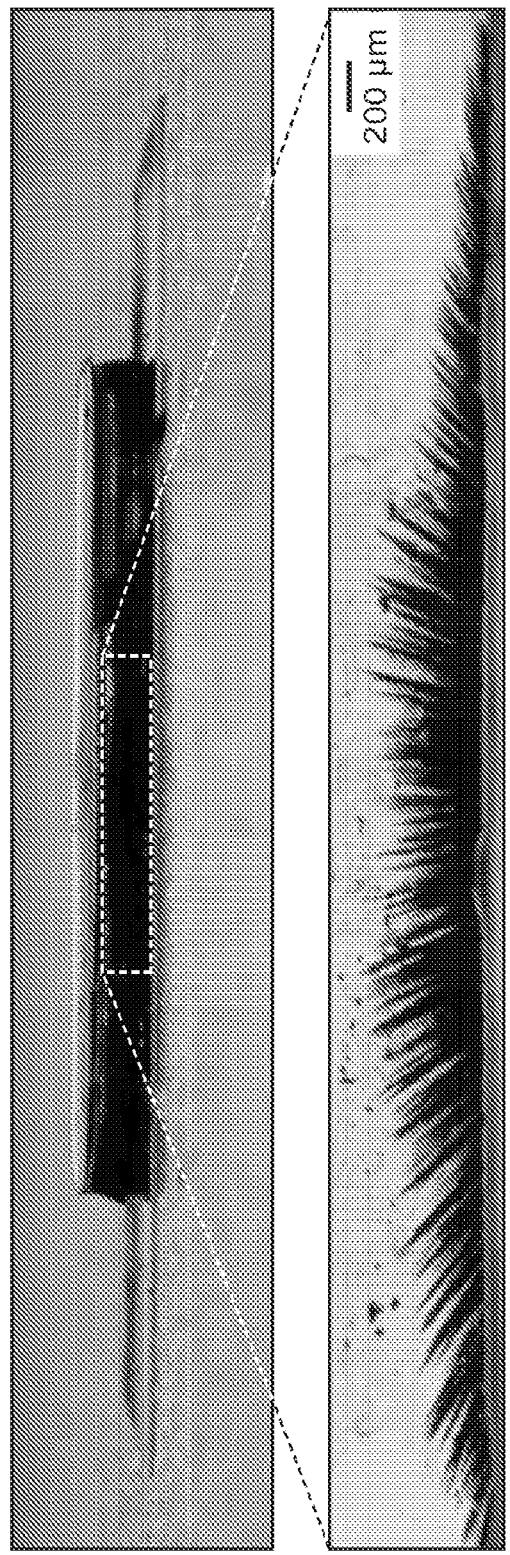
FIG. 10 illustrates distribution of the MNP chains at the cross section of the synthesized magnetic hydrogel according to embodiments.

To realize magnetic barcodes, a hydrogel network is employed as a biocompatible scaffold for magnetic chains encoded in anisotropically-magnetized orientations. Before gelation, a hydrogel prepolymer and magnetic chains are put under the spatially-patterned external magnetic field. The direction of magnetic chains is subsequently encoded into the hydrogel after gelation, and will react to various external magnetic fields differently. Use is made of polyacrylamide (PAAm) hydrogels as the scaffold for $Fe_3O_4$ nanoparticles due to its robustness, transparency, and polymerization mechanism. The hydrogel forms through a chemical mechanism that forms covalent bonds between the acrylamide and a crosslinking agent. The synthesis of the magnetic hydrogel is elaborated in the supplementary information. Before gelation, the precursor solution was pipetted into a three-dimensional (3D)-printed cubic mold under a static, spatially-varying magnetic field to align the MNPs in the direction of the external magnetic field as the gel forms. The gelation of the PAAm network freezes the location and orientation of the magnetic micro-chains resulting in encoded magnetic sites within the gel. The synthesis process is depicted in FIG. 9.

Magnetic Encoder Platform

Several techniques are realized to create spatio- or temporally-engineered magnetic fields. This can be utilized both as an encoder to create hydrogel barcodes, or a platform to selectively-manipulate barcodes in space and time. Here, primary focus is made on how these magnetic platforms can be used as encoders for magnetic barcodes. To create an encoded magnetic hydrogel composed of layers of vertical or horizontal magnetization codes, the gelling process should start under a bidirectionally patterned, steady-state magnetic field. This can be generated by an array of permanent magnets or electromagnets. This magnetic field's intensity should be as uniform as possible to induce rotational movement in the MNPs before gelation; otherwise, a strong gradient field would cause agglomeration and oversized magnetic chains. To ensure generating a magnetic field with relatively uniform intensity, the gelation process was performed about 3 mm away from a magnetic actuator.

Figure 3:
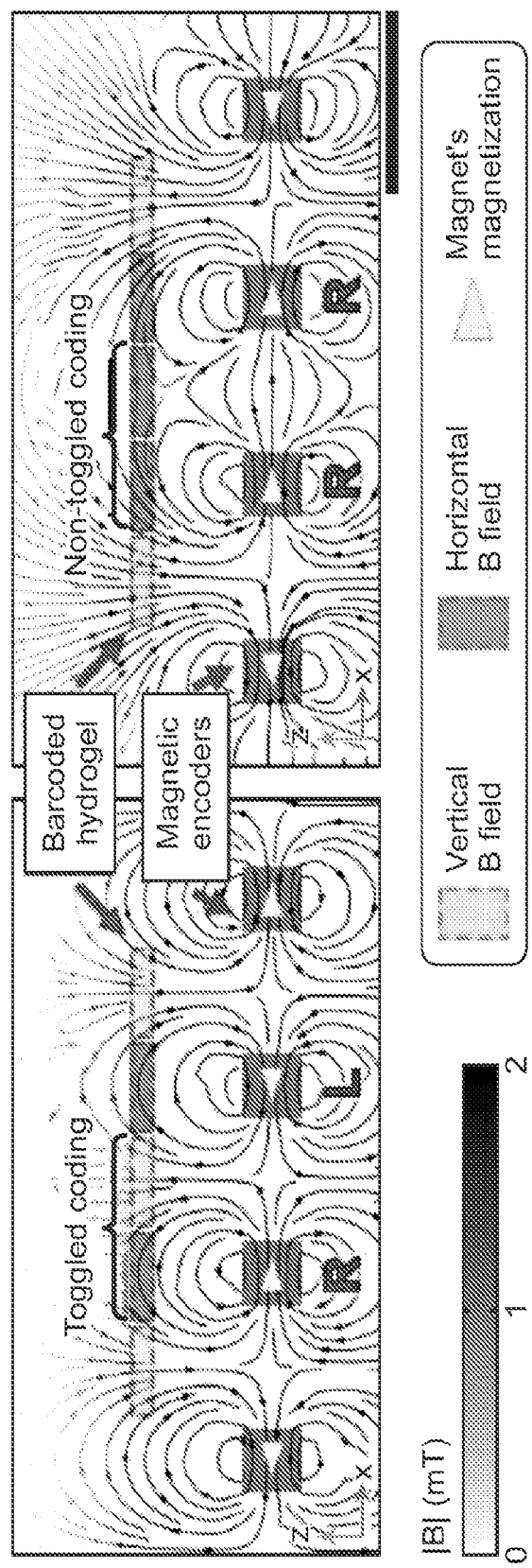
FIG. 3 illustrates a realization of bidirectional-encoded, magnetic hydrogels according to embodiments. A non-repeating code of magnets results in a toggled anisotropy code, and vice versa. A uniform magnetic intensity is observed a few millimeters above the magnets' surface (scale bar 5 mm).

In experiments herein, utilization is made of a streamlined method of barcoding hydrogels with a sequence of underlying permanent magnets (acting as the encoder here). The sequence of permanent magnet's magnetization in the encoder directly affects the magnetic chain orientation in the hydrogel. Typically, a single magnet (or electromagnet) creates magnetic fields in various directions. An engineered array of such magnets can result in constructive or canceling magnetic fields in a particular direction. For instance, the non-repeating magnet sequence of 'RL' (R in +x and L in −x directions) results in a toggled magnetic code of 'HV' (H for horizontal and V for vertical) above the array, while the repeating 'RR' sequence leads to a non-toggled 'HH' coding (FIG. 3).

With this technique, two building blocks can be employed as a streamlined encoding method. A variety of encoding methods can be used, depending on the desired physical manipulation approach. In this evaluation, generation of bidirectional magnetic fields is made by using an array of Neodymium cubic magnets (grade N42 with an edge of about 3.16 mm and spacing of about 1.15 mm). The magnetization vectors in the magnet array were designed to create vertical and horizontal streamlines on the hydrogel mold placed at $h_h$=about 3 mm above the magnets (FIG. 4) during the gel formation. To build a magnetic platform, the magnets were implanted in a 3D printed scaffold. Similar arrays are used to show the selective interaction.

Figures 4A, 4B:
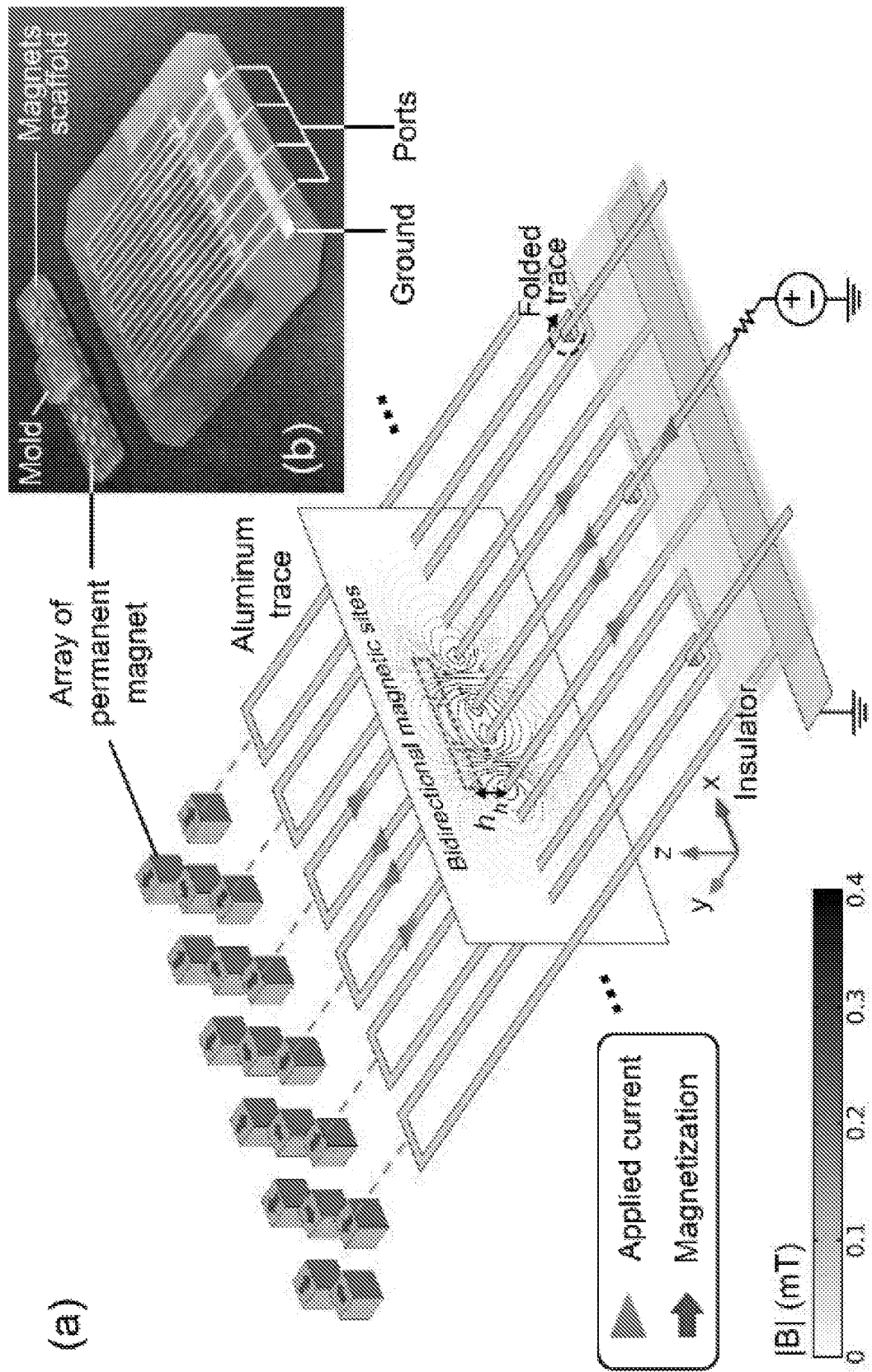
FIGS. 4(a) and 4(b) illustrate a realization of the magnetic-control platforms according to embodiments.

Although miniature magnets often generate a strong, high-resolution, and power supply-free magnetic field, they lack in temporally-programmable encoding characteristics. In addition, the rigid bulky system of macro-scale magnets/scaffolds is sometimes challenging for microelectromechanical systems or curved systems. This led to the design of a flexible printed circuit board where aluminum traces (with a width and thickness of about 14 µm of about 1.4 mm) were printed on a flexible thin vinyl film. The schematic of the planar coils along with their resultant bidirectional magnetic streamlines are depicted in FIG. 4. The generated field of the parallel traces can be analytically calculated from the Biot-Savart law. The distribution of the magnetic fields generated from the permanent magnets and planar coils are compared in FIG. 11.

In general, permanent magnets were used to encode magnetically-barcoded hydrogels because of their stronger magnetic field. Additionally, the heat released from current-carrying planar coils expedites the gelation process and may complicate the formation of magnetic nanoparticles into well-shaped micro-chains.

Figures 5A, 5B, 5C, 5D:
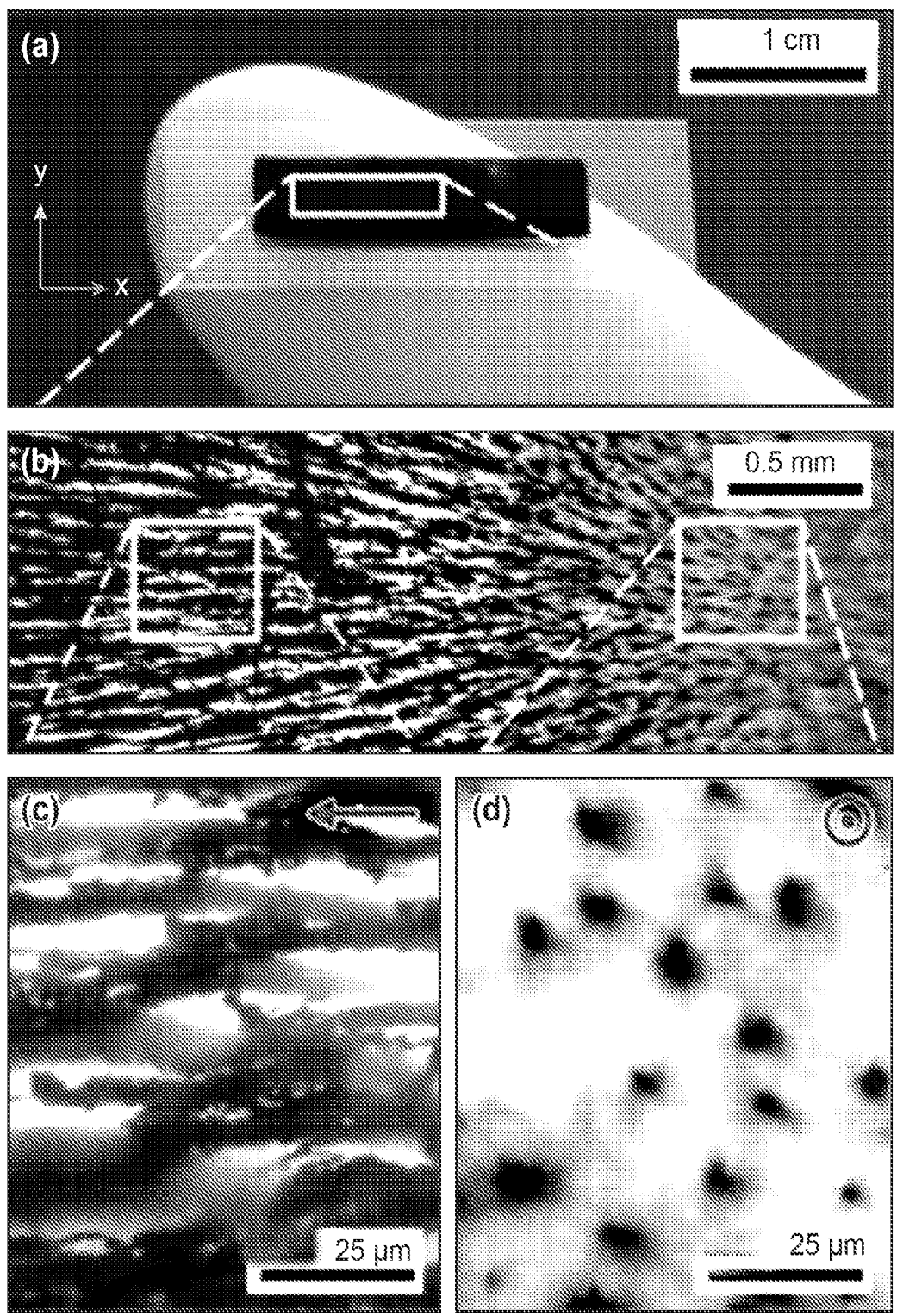
FIGS. 5(a) to 5(d) illustrate how programmable bidirectional magnetic chains create an anisotropic permeability characteristic, realizing a magnetically-encoded hydrogel for selective manipulation according to embodiments.

After completion of gelation, the magnetically-barcoded hydrogels were demolded and placed on a plastic coverslip. Observation is made of the anisotropic magnetic chains with an average thickness of about 4.5 µm formed in vertical and horizontal directions. The morphology of the MNP chains is shown in FIG. 5. The transparent PAAm hydrogel behaves like a scaffold to lock MNPs in place in absence of the magnets.

Experimental Samples

To show the selective interaction of magnetic barcoded tags with the magnetic platform, the hydrogel/coverslip stack was set free on the water above magnet arrays. In the rest of this section, demonstration is made of two examples of magnetic encoding with potential use in as next-generation magnetic interfaces.

Untethered Anchoring

The selective positioning of multiple, magnetically-controlled tags fitted in a defined area is a major challenge that can be addressed by untethered, selective anchoring to engineered sites.

Figures 6A, 6B, 6C:
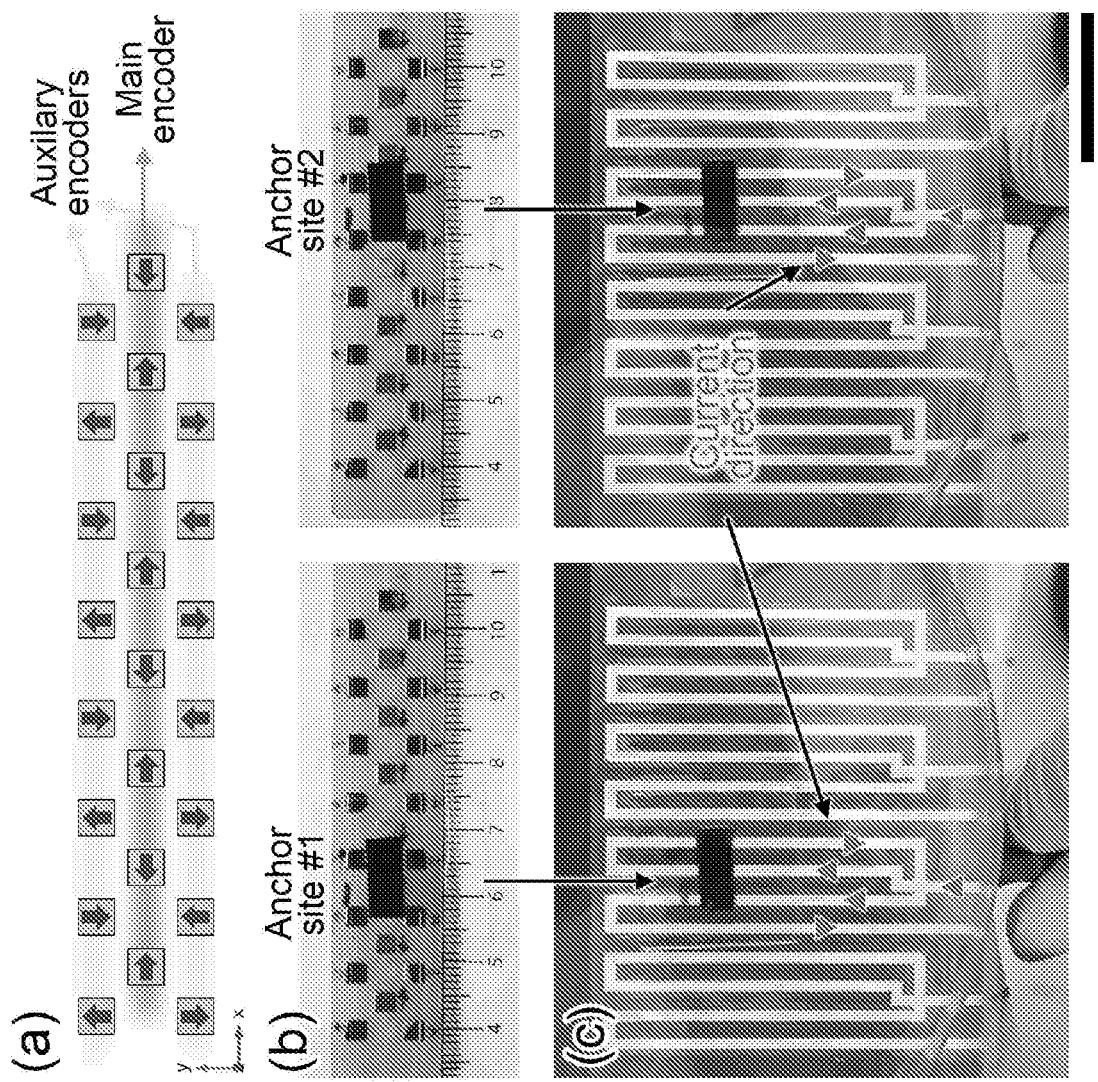
FIGS. 6(a) to 6(c) illustrate selective anchoring of a magnetically-encoded hydrogel to multiple positions according to embodiments.

To encode the magnetic chains into the hydrogel, the main array of magnets with a set of non-repeating codes was designed. Although Neodymium magnets usually produce strong magnetic fields, to reach more intense magnetic fields intensity in the gelation zone, two auxiliary sets of side magnets were added to the design. The axillary magnets are oriented such that they constructively interfere with the main array's field at top of the magnetic encoders where the gelation occurs. The magnetization code of the array is depicted in FIG. 6(a).

It was observed that the hydrogel selectively interacts with the set of magnets within the external platform whose code matches that of the hydrogel. The anchor sites (FIG. 5(a)) can be accordingly adjusted by changing the distance between the magnets. The escape energy (depicted in FIG. 2(b)) was externally applied to evaluate different anchor sites. Furthermore, planar coils with selective anchor sites could be utilized to create multiple, programmable interaction sites, and is shown in FIG. 6(b). The selected coil runs a current of about 3 A for a short amount of time to attract the encoded hydrogel.

Magnetic Barcodes and Latching Function

Figure 7A:
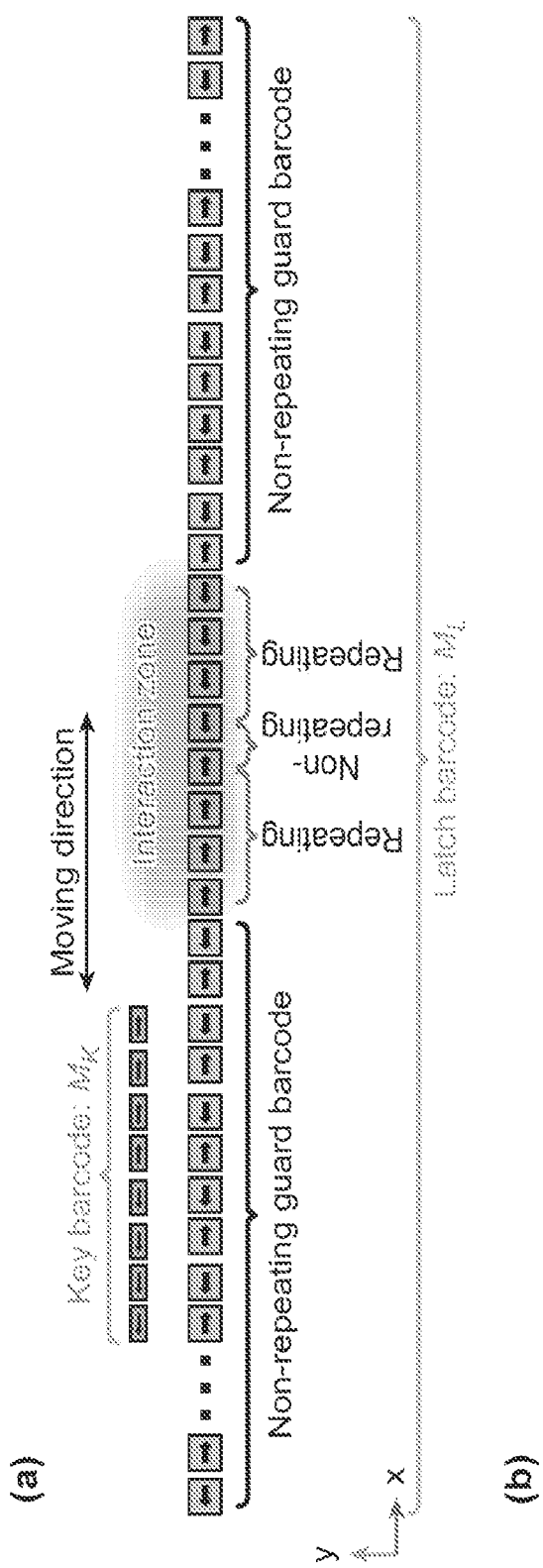
FIGS. 7(a) and 7(b) illustrate a demonstration of a latch system by magnetically-barcoded materials according to embodiments.

The concept of selective magnetic manipulation can be of significant help in a wide range of biomedical applications such as advanced tissue engineering or drug delivery, where the external stimulation functions to latch particles to specific areas. With the barcode concepts proposed herein, specific tags would interact with its key, allowing selective localization of specific objects (such as drugs or microgels). For instance, suppose there is a given code of magnetization in an encoded hydrogel platform (see FIG. 7(a)). By sweeping the hydrogel (the key) over the magnetic system (the latch), it will become anchored in an anticipated latch site with a matching code. The guard sites of the latch should not interact with the key codes.

To evaluate a large number of unmatched random guard codes, consideration is made of the correlation concept between the latch and key codes quantified in and calculated by:

$$\sigma = \frac{-\sum_{i=1}^{P}\left((m_{L_i} - \overline{M_L})(m_{K_i} - \overline{M_K})\right)}{\sqrt{\sum_{i=1}^{P}(m_{L_i} - \overline{M_L})^2 \times \sum_{i=1}^{Q}(m_{K_i} - \overline{M_K})^2}} \quad (1)$$

where $$M_L = \{m_{L_i}\}_{i=1,2,\ldots P}$$

and $$M_K = \{m_{K_i}\}_{i=1,2,\ldots Q}$$

represent the array of magnetization vector codes of the latch and the key, respectively. It is assumed that the length of the latch is greater than that of the key (P≥Q). In one-dimensional latching system, the array elements can take a value of ±1 to represent the magnetization barcode along the x-axis. This is to include the role of repeating and non-repeating coding. The bar sign indicates the mean value of the array. The correlation depends on the key's location ($x_h$) and $M_K$ is accordingly shifted to reflect the key's movement. A full match and full mismatch are indicted by σ=+1 and −1, respectively.

Figure 7B:
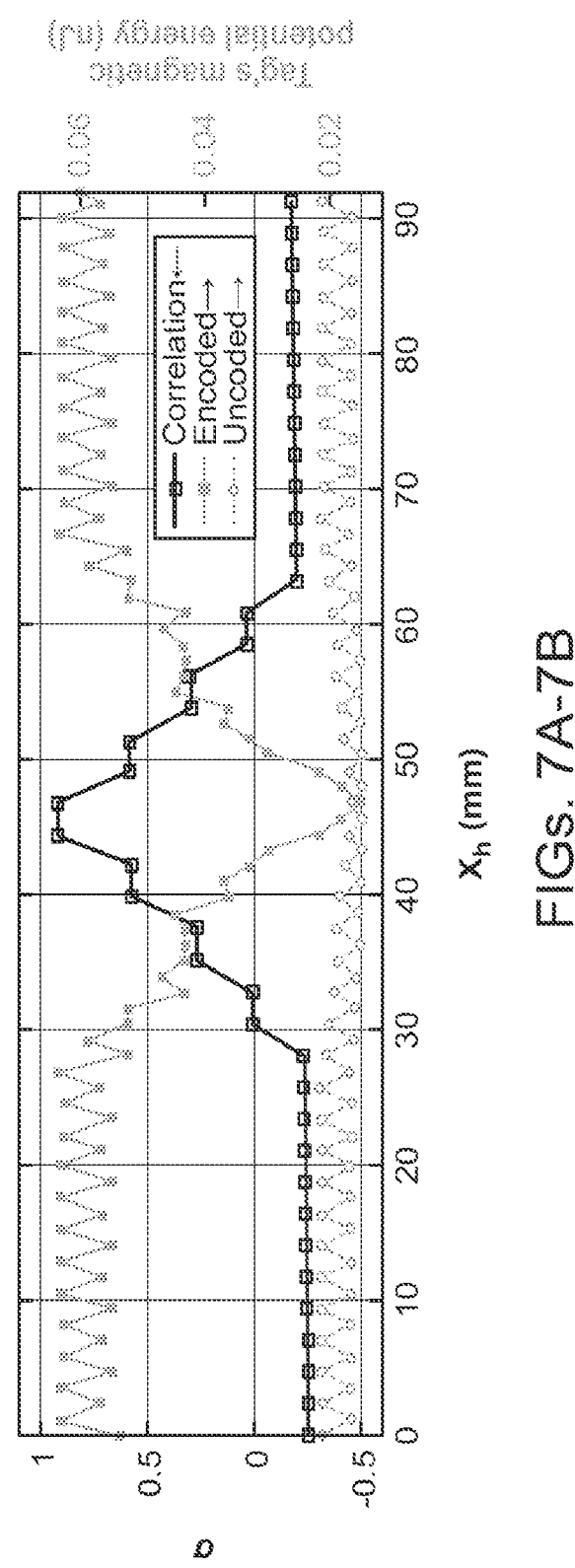

As an illustration, suppose there is a repeating latch barcode surrounded by two non-repeating guard barcodes. By sweeping the key over the latch, observation is made of a good resemblance between analytically calculated σ and the magnetic potential energy in the barcoded key calculated by the finite element method performed in COMSOL. Therefore, σ can be used as a fast indication of the latching operation to generate hundreds of barcodes. In addition, the magnetic potential energy of a tag with isotropic magnetization (with a relative permeability of 1000) is compared with that of the encoded tag (FIG. 7(b)).

Figure 13:
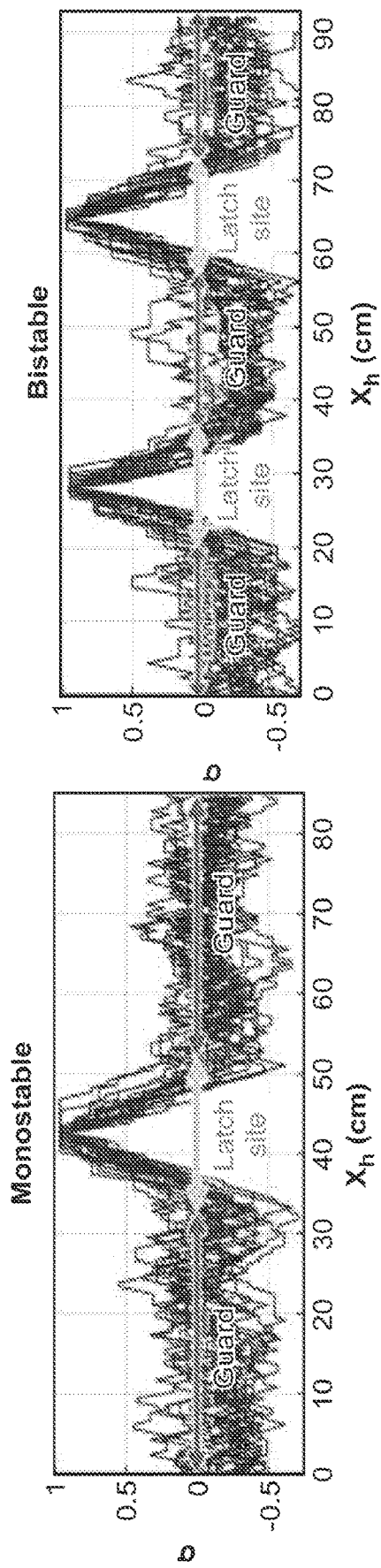
FIG. 13 illustrates the correlation plot repeated for 20 random guard barcodes according to embodiments. It is observed that a reliable monostable latch operation that can be generalized into a bistable function.

After recalculating σ for random guard barcodes, it is found that a large number of different guard barcodes can be generated without affecting the latching function (FIG. 13). This shows that one barcoded encoder can handle multiple tags, or similarly, a single-latch system can be optimized for a multi-stable latch, which is utilized in microelectromechanical systems. However, a proper code should be considered to induce accurate and uninterfered latching operation.

Figure 8A:
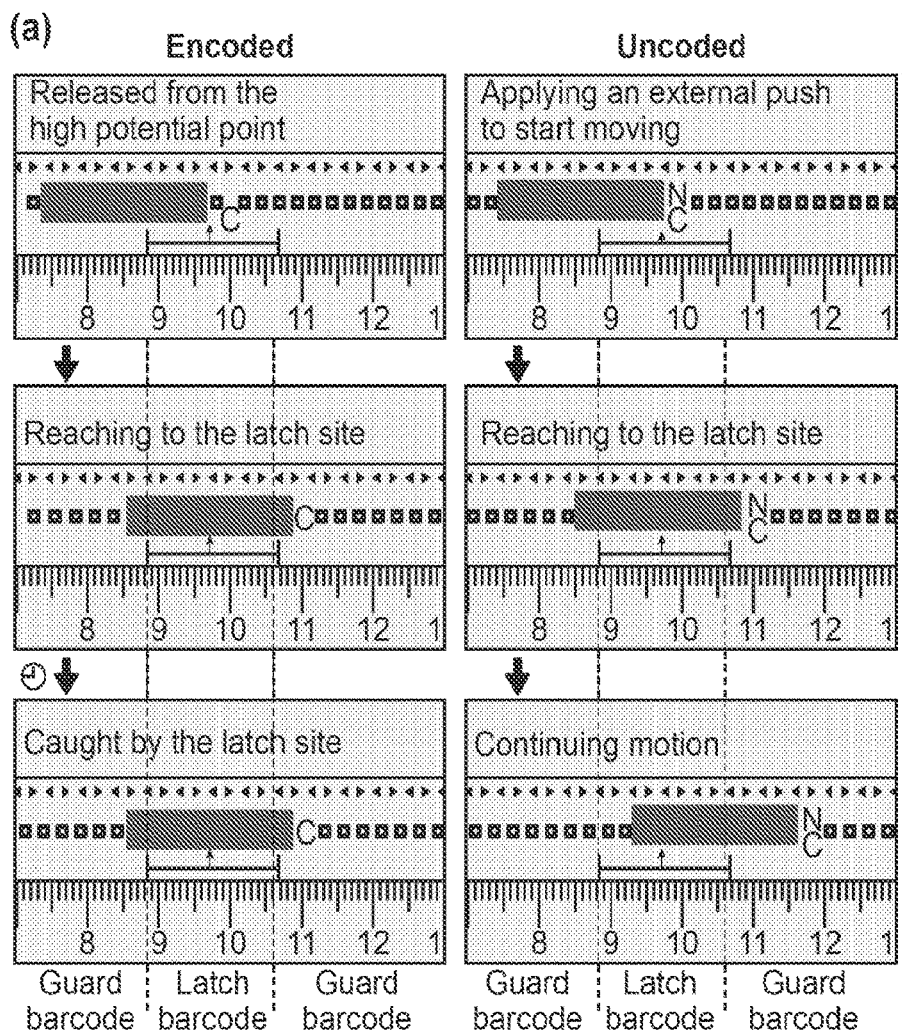
FIGS. 8(a) to 8(c) illustrate selective manipulation of magnetically-barcoded materials according to embodiments. The comparison between the movements of (FIG. 8(a)) the magnetically coded hydrogel versus (FIG. 8(b)) uncoded magnetic hydrogel. Neodymium magnets ith an edge of about 1.6 mm were used here. The implemented barcodes are shown in FIG. 7.
Figure 8B:
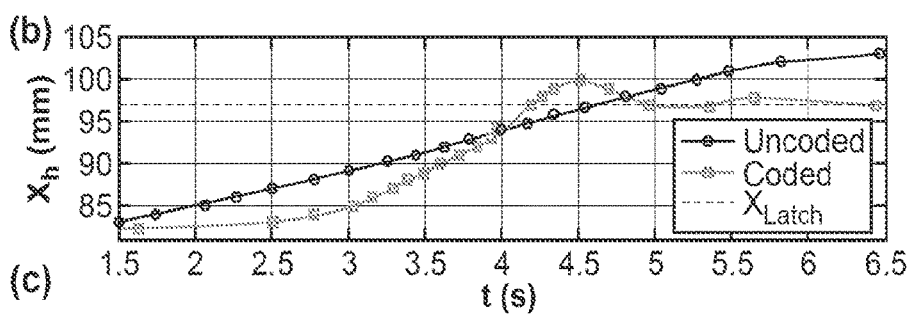
Figure 8C:
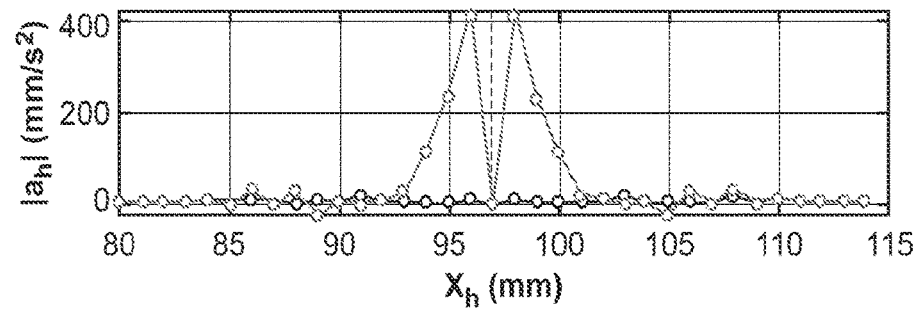

The monostable latch function was validated through another magnet-based barcode. Synthesis is made of one magnetic hydrogel gelled under barcoded magnetic fields and another gelled in absence of magnetic fields. The rest of the experiment was designed similar to the anchoring example. As shown in FIG. 8(a), the encoded hydrogel was released close to the latch site and started moving until reaching the latch site. On the other hand, although the uncoded hydrogel was externally pushed toward the latching site, it did not react to the latch barcode and went around. The motion plots of these cases are compared in FIG. 8(b).

Conclusion

An inhomogeneous code of bidirectional magnetic microchains adds degrees of freedom to magnetic materials and allows selective attraction of particular targets in a magnetic background. Inspired from biological systems with selective responses, this strategy works on a key-lock basis where a matching key selectively reacts to a lock. A proper coding protocol can produce tens of different codes to engage multiple tags in a multi-latch system. The correlation factor between the key and lock barcodes is introduced to represent the coding functionality on a mathematical basis and ease the design of coding protocols for various situations. The introduced barcoded materials are realized using a procedure including the synthesis of magnetic hydrogels along with the 3D printing technique to fabricate the magnetic platform. The proposed structure is made out of a biocompatible polymeric network and magnetic nanoparticles which make it suitable for biomedical applications. Moreover, the flexible and programmable characteristic of the magnetic platform can be utilized to trap tags in special geometrical situations and dynamic conditions.

Supporting Information

A. Synthesis of the Magnetically-Barcoded Materials

Use is made of polyacrylamide (PAAm) hydrogels as the vessels for the MNPs due to their strength, transparency, and polymerization mechanism. Acrylamide (AAm—Sima-Aldrich) is a produced α,β-unsaturated reactive molecule that serves as the primary, synthetic monomer in the PAAm hydrogel. When combined with n,n'-methylenebis(acrylamide) (Sima-Aldrich) (MBA) in the presence of tetramethylethylenediamine (TEMED) and ammonium persulfate (APS—Sima-Aldrich), the hydrogel forms through a chemical crosslinking mechanism—free radical polymerization—that forms covalent bonds between the acrylamide and the MBA. The resulting hydrogel forms quickly at room temperature, resists compression and tension well and appears very transparent.

For the PAAm-MNP hydrogel, a precursor solution composed of about 10% (w/w) AAm, about 6% (w/w of AAm) MBA, and about 21.15 mg/mL $Fe_3O_4$ nanoparticles (about 50-100 nm particle size, about 97% trace metals basis, purchased from Sigma-Aldrich) was vortexed for about 15 minutes to ensure proper distribution of the MNPs. Next, about 10% APS and about 100% TEMED were added to the precursor solution at final concentrations of about 0.25% (w/w) APS and about 0.14% (v/v) TEMED respectively to begin the polymerization. Quickly, the precursor solution was pipetted into a 3D-printed cubic mold under the steady magnetic field to align the MNPs in the direction of the external magnetic field as the gel forms.

B. Magnetic Encoder Platform

Figure 11:
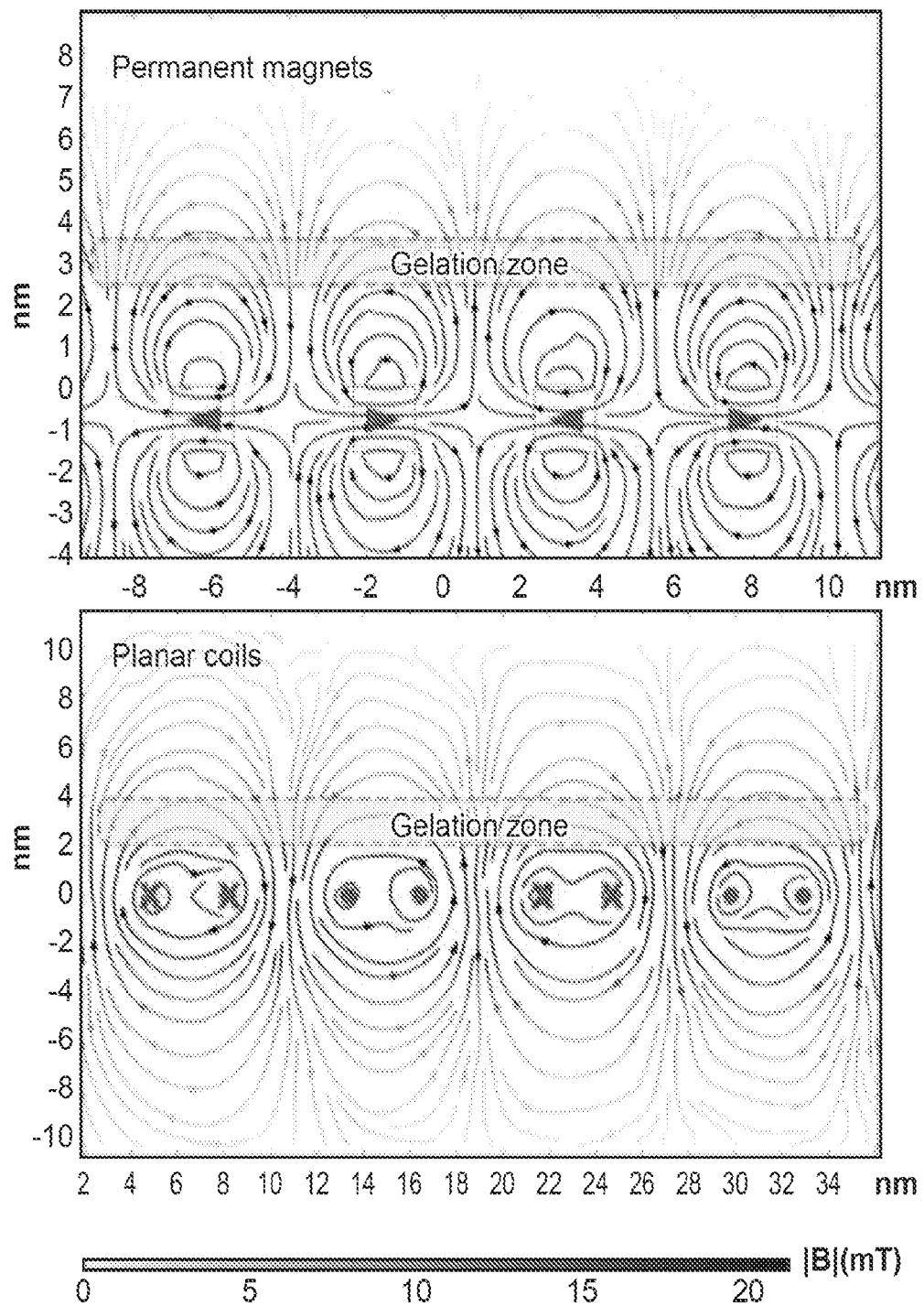
Figures 12A, 12B:
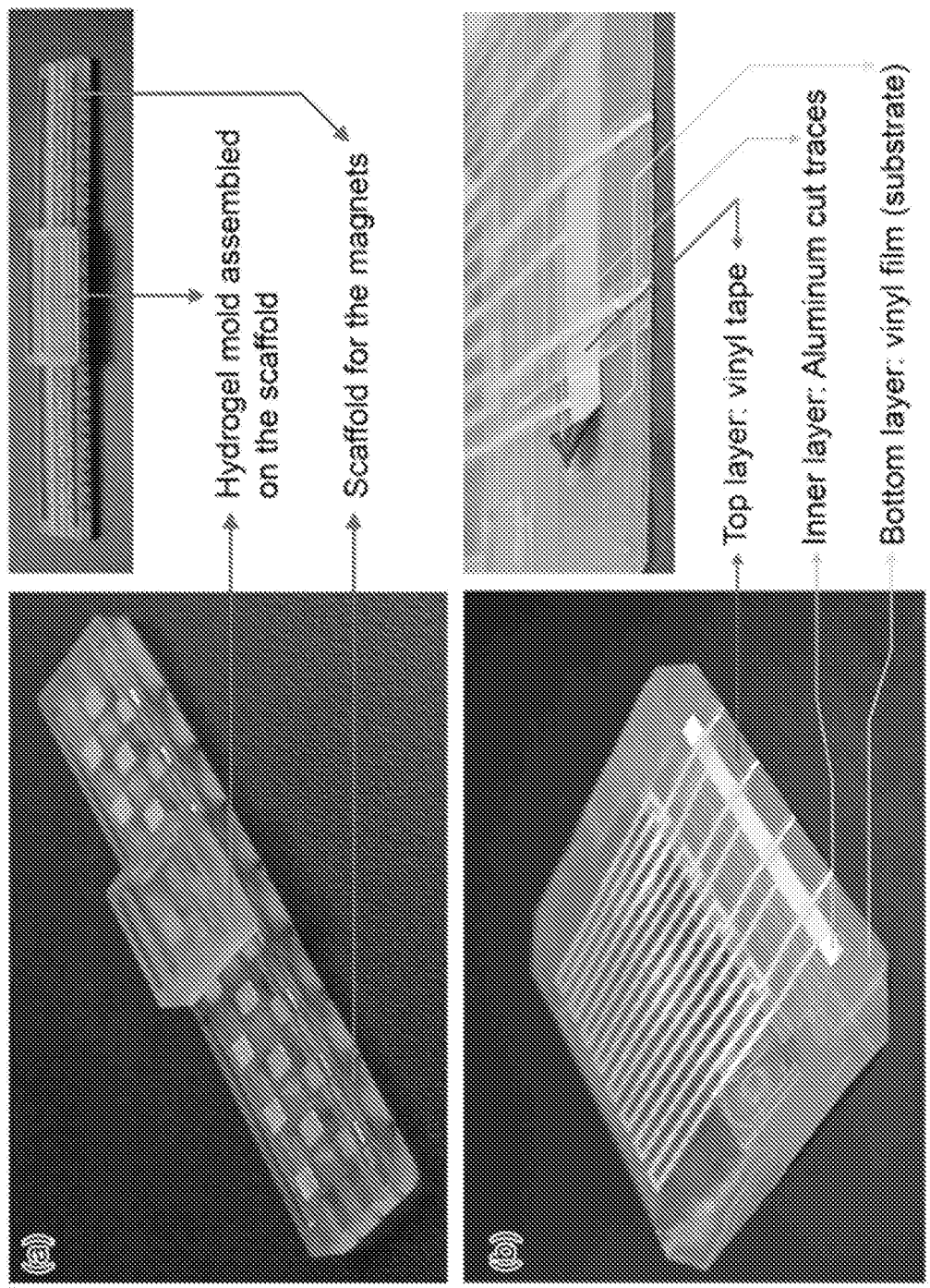
FIGS. 12(a) and 12(b) illustrate demonstration of different parts of the magnetic encoders according to embodiments.

Two methods are proposed to create a hydrogel encoder platform by permanent magnets and planar coils. The distributions of the resultant magnetic fields are enormously similar in the gelation zone (FIG. 11). In order to fabricate the planar coils, an aluminum foil was fixed on the covering self-adhesive vinyl film. The aluminum/vinyl layers were stacked on the adhesive cutting mat. The aluminum foil was cut using the cutting machine Silhouette Cameo 3 (Silhouette America® Inc., Lindon, Utah, USA). The complement pattern of the metal foil was removed after cutting. Vinyl tape was used as an insulator to avoid short-circuits to the ground (FIG. 12).

C. Generalization of the Key/Latch Experimental Sample

Here, demonstration is made of the correlation versus the tag's location for a monostable (P=200, Q=18) and a bistable (P=200, Q=18+18) latch systems (FIG. 13). Observation is made that the combination of 20 randomly generated guard codes with the same repeating latch code results in no interference and the key/latch correlation at the latch site is still much greater than that at a guard site. A longer key code (greater Q) results in more reliable latching, or in other words, this lowers the probability of making a latch site at an unwanted location.

Example Embodiments

In some embodiments according to a first aspect, a method of magnetic manipulation includes: providing an object including, or affixed with, a magnetic barcode, the magnetic barcode including an array of spatially varying magnetization vectors; and placing a magnetic platform adjacent to the object, the magnetic platform including a latch site generating a magnetic field whose streamlines align with the array of magnetization vectors of the magnetic barcode, wherein the object selectively interacts with the latch site.

In some embodiments according to the first aspect, the array of magnetization vectors is a one-dimensional array. In some embodiments, the array of magnetization vectors is a two-dimensional array. In some embodiments, the array of magnetization vectors include at least a first magnetization vector along a first direction, and at least a second magnetization vector along a second direction substantially perpendicular to the first direction.

In some embodiments according to the first aspect, the magnetic barcode includes a matrix and magnetic chains dispersed in the matrix in spatially varying orientations across multiple domains in the matrix. In some embodiments, the matrix is a biocompatible scaffold. In some embodiments, the matrix is a hydrogel.

In some embodiments according to the first aspect, the latch site includes an array of magnets, such as an array of permanent magnets or an array of electromagnets. In some embodiments, the array of magnets are arranged to have an array of magnetization vectors that align with the array of magnetization vectors of the magnetic barcode.

In some embodiments according to the first aspect, providing the object includes providing multiple objects including the object as a first object, the multiple objects include respective and different magnetic barcodes, and the first object selectively interacts with the latch site, from among the multiple objects.

In some embodiments according to a second aspect, a method of forming a magnetic barcode includes: providing a gel precursor solution including dispersed magnetic particles; and inducing gelation of the precursor solution in the presence of a spatially varying magnetic field to yield a gel in which the magnetic particles are aligned into magnetic chains having spatially varying orientations across multiple domains in the gel.

In some embodiments according to a third aspect, a magnetic barcode includes a matrix and magnetic chains dispersed in the matrix in spatially varying orientations across multiple domains in the matrix. In some embodiments, the domains include at least a first domain including a first set of magnetic chains aligned along a first direction, and at least a second domain including a second set of magnetic chains aligned along a second direction substantially perpendicular to the first direction.

In some embodiments according to a fourth aspect, a programmable magnetic platform includes: an array of electromagnets; a set of current sources connected to the array of electromagnets; and a controller connected to the set of current sources, the controller is configured to receive an input magnetic barcode, and to direct the set of current sources to actuate the array of magnets to have an array of magnetization vectors according to the input magnetic barcode. In some embodiments, the controller includes a processor and a memory storing processor-executable instructions.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" or "about" the same as or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, substantially parallel can refer to a range of angular variation relative to 0° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, substantially perpendicular can refer to a range of angular variation relative to 90° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claim(s). In addition, many modifications may be made to adapt a particular situation, material, composition of matter, method, operation or operations, to the objective, spirit and scope of the disclosure. All such modifications are intended to be within the scope of the claim(s) appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations is not a limitation of the disclosure.

What is claimed is:

1. A method of magnetic manipulation, comprising:
   providing an object including a magnetic barcode, the magnetic barcode including an array of spatially varying magnetization vectors formed in a biocompatible material; and
   placing a magnetic platform adjacent to the object, the magnetic platform including a latch site generating a magnetic field whose streamlines align with the array of magnetization vectors of the magnetic barcode, wherein the object selectively interacts with the latch site.

2. The method of claim 1, wherein the array of magnetization vectors is a one-dimensional array.

3. The method of claim 1, wherein the array of magnetization vectors is a two-dimensional array.

4. The method of claim 1, wherein the array of magnetization vectors include at least a first magnetization vector along a first direction, and at least a second magnetization vector along a second direction substantially perpendicular to the first direction.

5. The method of claim 1, wherein the magnetic barcode includes a matrix of the biocompatible material and magnetic chains dispersed in the matrix in spatially varying orientations across multiple domains in the matrix.

6. The method of claim 5, wherein the biocompatible material is a hydrogel.

7. The method of claim 1, wherein the latch site includes an array of magnets.

8. The method of claim 7, wherein the array of magnets are arranged to have an array of magnetization vectors that align with the array of magnetization vectors of the magnetic barcode.

9. The method of claim 1, wherein providing the object includes providing multiple objects including the object as a first object, the multiple objects include respective and different magnetic barcodes, and the first object selectively interacts with the latch site, from among the multiple objects.

10. The method of claim 1, wherein the biocompatible material is a hydrogel.

11. The method of claim 10, wherein the hydrogel is a polyacrylamide (PAAm) hydrogel.

12. The method of claim 10, wherein providing the object includes forming the array of spatially varying magnetization vectors using a magnetic material in the hydrogel.

13. The method of claim 12, wherein forming the array of spatially varying magnetization vectors includes trapping magnetic nanoparticles (MNPs) in a chain orientation during gelation of the hydrogel.

14. The method of claim 13, wherein the chain orientation is bidirectional.

15. A method of forming a magnetic barcode, comprising:
providing a gel precursor solution including dispersed magnetic particles; and
inducing gelation of the precursor solution in the presence of a spatially varying magnetic field to yield a gel in which the magnetic particles are aligned into magnetic chains having spatially varying orientations across multiple domains in the gel.

16. A magnetic barcode, comprising a matrix of biocompatible material and magnetic chains dispersed in the matrix in spatially varying orientations across multiple domains in the matrix.

17. The magnetic barcode of claim 16, wherein the domains include at least a first domain including a first set of magnetic chains aligned along a first direction, and at least a second domain including a second set of magnetic chains aligned along a second direction substantially perpendicular to the first direction.

18. A programmable magnetic platform, comprising:
an array of electromagnets;
a set of current sources connected to the array of electromagnets; and
a controller connected to the set of current sources, the controller is configured to receive an input magnetic barcode, and to direct the set of current sources to actuate the array of magnets to have an array of magnetization vectors according to the input magnetic barcode.

* * * * *